United States Patent
Lin et al.

(10) Patent No.: US 10,786,880 B2
(45) Date of Patent: Sep. 29, 2020

(54) CARRIER FRAME

(71) Applicant: BOE TECHNOLOGY GROUP CO., LTD., Beijing (CN)

(72) Inventors: Jianhai Lin, Beijing (CN); Jiabin Xie, Beijing (CN); Zailin Hong, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 102 days.

(21) Appl. No.: 16/140,937

(22) Filed: Sep. 25, 2018

(65) Prior Publication Data

US 2019/0202012 A1   Jul. 4, 2019

(30) Foreign Application Priority Data

Jan. 2, 2018  (CN) .................. 2018 2 0002974 U

(51) Int. Cl.
*B23Q 3/18*  (2006.01)
*B23Q 1/03*  (2006.01)
*H01L 51/56*  (2006.01)

(52) U.S. Cl.
CPC .............. B23Q 1/035 (2013.01); H01L 51/56 (2013.01)

(58) Field of Classification Search
CPC ... B23Q 1/00; B23Q 1/03; B23Q 1/25; B23Q 3/00
See application file for complete search history.

(56) References Cited

U.S. PATENT DOCUMENTS

| 5,303,645 A * | 4/1994 | Meacham | A47B 57/545 108/147.13 |
| 6,178,896 B1 * | 1/2001 | Houk, Jr. | A47B 87/0223 108/157.13 |
| 6,752,278 B2 * | 6/2004 | Craft | A47B 81/00 211/85.7 |
| 7,658,154 B2 * | 2/2010 | Yankello | A47B 87/0246 108/147.13 |
| 8,001,911 B2 * | 8/2011 | Yankello | A47B 87/0246 108/147.13 |
| 9,137,981 B1 * | 9/2015 | Groves, Jr. | A47B 81/005 |
| 9,468,200 B1 * | 10/2016 | Davis | A01K 97/00 |
| 9,538,846 B2 * | 1/2017 | Reinhart | A47B 96/02 |
| 2016/0102784 A1 * | 4/2016 | Masters | F16L 3/2235 248/68.1 |

FOREIGN PATENT DOCUMENTS

CN  204913677 U  12/2015
CN  205219080 U  5/2016

* cited by examiner

*Primary Examiner* — Lee D Wilson
(74) *Attorney, Agent, or Firm* — Calfee, Halter & Griswold LLP

(57) ABSTRACT

The present disclosure discloses a carrier frame, which includes at least two plug boards and a plurality of hollow insert parts. Each plug board includes a plurality of hollow insert parts, either end of the support rod is configured to be inserted into any one of the hollow insert parts; the carrier frame has a first state, in the first state, the at least two plug boards are arranged in parallel and the two adjacent plug boards are connected through the support rods.

10 Claims, 6 Drawing Sheets

CARRIER FRAME

CROSS-REFERENCE TO RELATED APPLICATIONS

This application is based on and claims priority to Chinese Patent Application No. 201820002974.7, filed on Jan. 2, 2018, the contents of which are incorporated herein by reference in its entirety.

TECHNICAL FIELD

The present disclosure relates to a carrier frame.

BACKGROUND

Housing is a common component in the structure of the backlight module. It is generally rectangular and includes four elongated side portions. After a mass production by the manufacturer, housings are firstly placed on the carrier frames, and subjected to post-processing steps such as burr trimming, and then transferred from the carrier frame to the packing tray so as to be transported to the backlight module manufacturer. During assembly by the backlight module manufacture, the plurality of housings are firstly removed from the packaging tray to the carrier frame, and then removed from the carrier frame into the backlight module one by one so as to be assembled.

The defects of the above related technologies are that the housing needs to be transported several times from production to assembly into the backlight module, which is not only inefficient, but also easy to cause deformation and damage. The packaging tray used for transporting the housings is usually a polyethylene terephthalate (PET) plastic tray with larger volume and thinner width, which is very easy to gather dust and produce deformation; in addition, the carrier frames and packaging trays of related technology are specially designed for a certain size housing without universality. Therefore, housing and backlight module have higher production cost and lower production efficiency directly due to the above defects.

SUMMARY

The carrier frame provided by the embodiment of the present disclosure includes at least two plug boards and a plurality of support rods. Each plug board comprises a plurality of hollow insert parts; either end of the support rod is configured to be inserted into any one of the hollow insert parts; the carrier frame has a first state, in the first state, the at least two plug boards are arranged in parallel and two adjacent plug boards are connected through the support rods.

According to an embodiment, the plurality of hollow insert parts are evenly distributed on each plug board, each hollow insert part comprises a plurality of insertion holes, and either end of the support rod is configured to be inserted and fixed in any one of the insertion holes.

According to an embodiment, the insertion hole is a strip-shaped insertion hole, a length direction of the strip-shaped insertion hole is set along a first direction, the plurality of strip-shaped insertion holes of each hollow insert part are arranged along a second direction in sequence.

According to an embodiment, the hollow insert part further comprises a strip-shaped guide hole, the strip-shaped guide hole of each hollow insert part and the plurality of strip-shaped insertion holes are cross and communicated with each other, either end of the support rod is configured to be inserted into the strip-shaped guide hole and slide in any one of the strip-shaped insertion holes so as to be fixed.

According to an embodiment, both ends of the support rod respectively have an annular clamping groove, a groove width of the annular clamping groove is approximately equal to a thickness of the plug board.

According to an embodiment, the both ends of the support rod respectively have a rubber sleeve, and both ends of the support rod are in interference fit with the insertion hole through the rubber sleeve.

According to an embodiment, a cross sectional shape of the support rod is a circle, a square or a hexagon.

According to an embodiment, a material of the plug board is polycarbonate, and a material of the support rod is polycarbonate.

According to an embodiment, a number of the plug boards is three, when the carrier frame is in the first state, the three plug boards are arranged in parallel and the two adjacent plug boards are connected through the support rod.

According to an embodiment, an insertion groove is arranged on one surface of the plug board; the carrier frame has a second state, in the second state, one of two plug boards is inserted into the insertion groove of the other one of the two plug boards.

According to an embodiment, an angle between the insertion groove and the plug board is an acute angle.

According to an embodiment, the angle between the insertion groove and the plug board is 45 degrees or 60 degrees.

According to an embodiment, a groove wall of the insertion groove is provided with a rubber pad.

DETAILED DESCRIPTION

In order to make the carrier frame universal, reduce the risk of deformation and damage of the frame during transportation, improve the transportation efficiency of the frame and reduce the production cost, the embodiment of the present disclosure provides a carrier frame. In order to make the objectives, technical solutions and advantages of the present disclosure more clear, the following embodiments further illustrate the present disclosure in detail.

Figure 1:
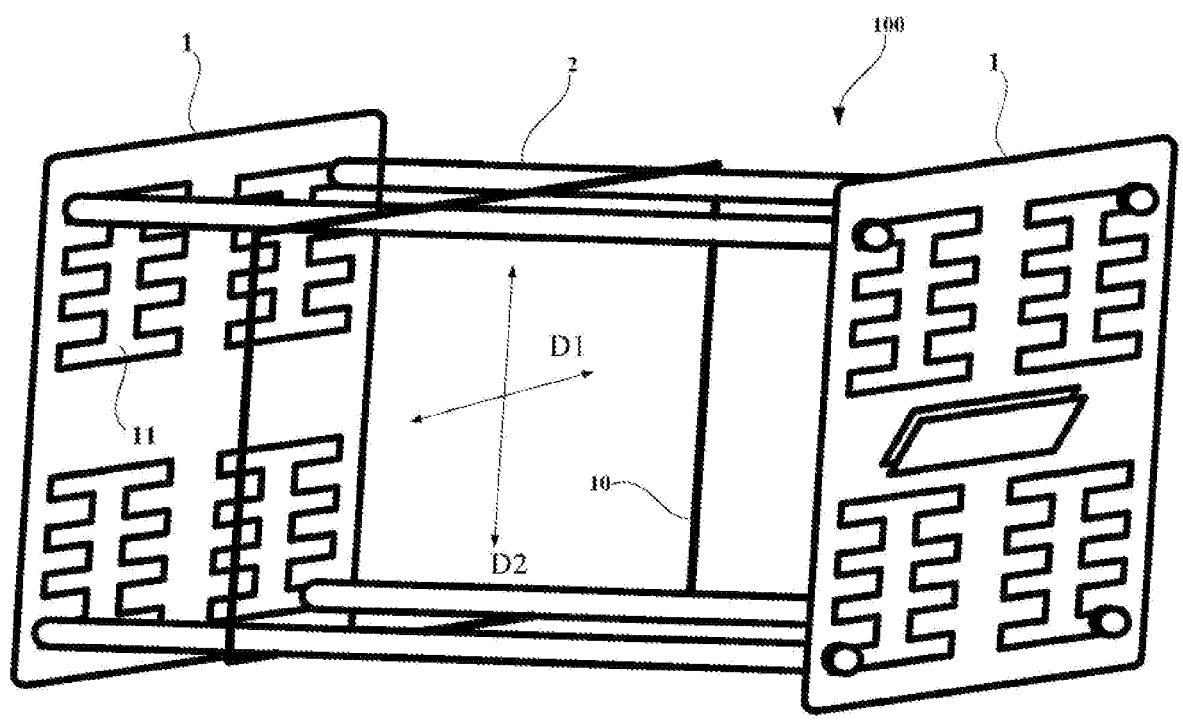
FIG. 1 is a schematic structural view of a carrier frame according to an embodiment of the present disclosure.
Figure 2:
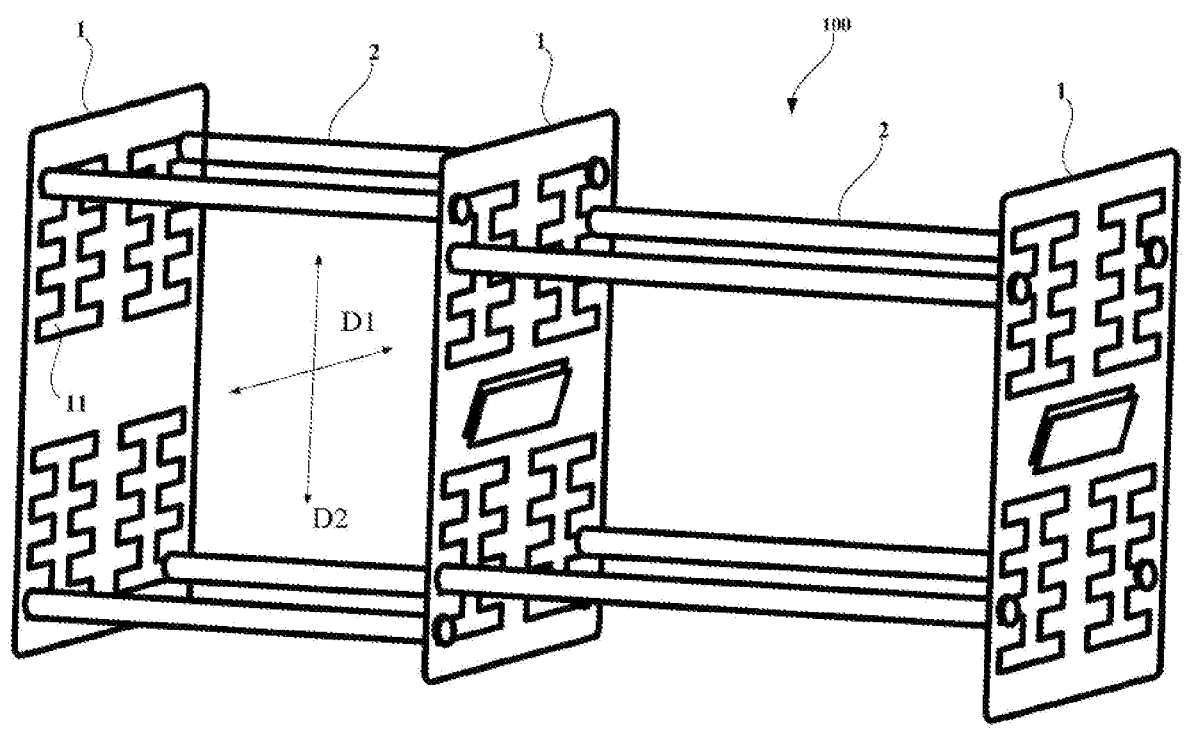
FIG. 2 is a schematic structural view of a carrier frame according to another embodiment of the disclosure.
Figure 4:
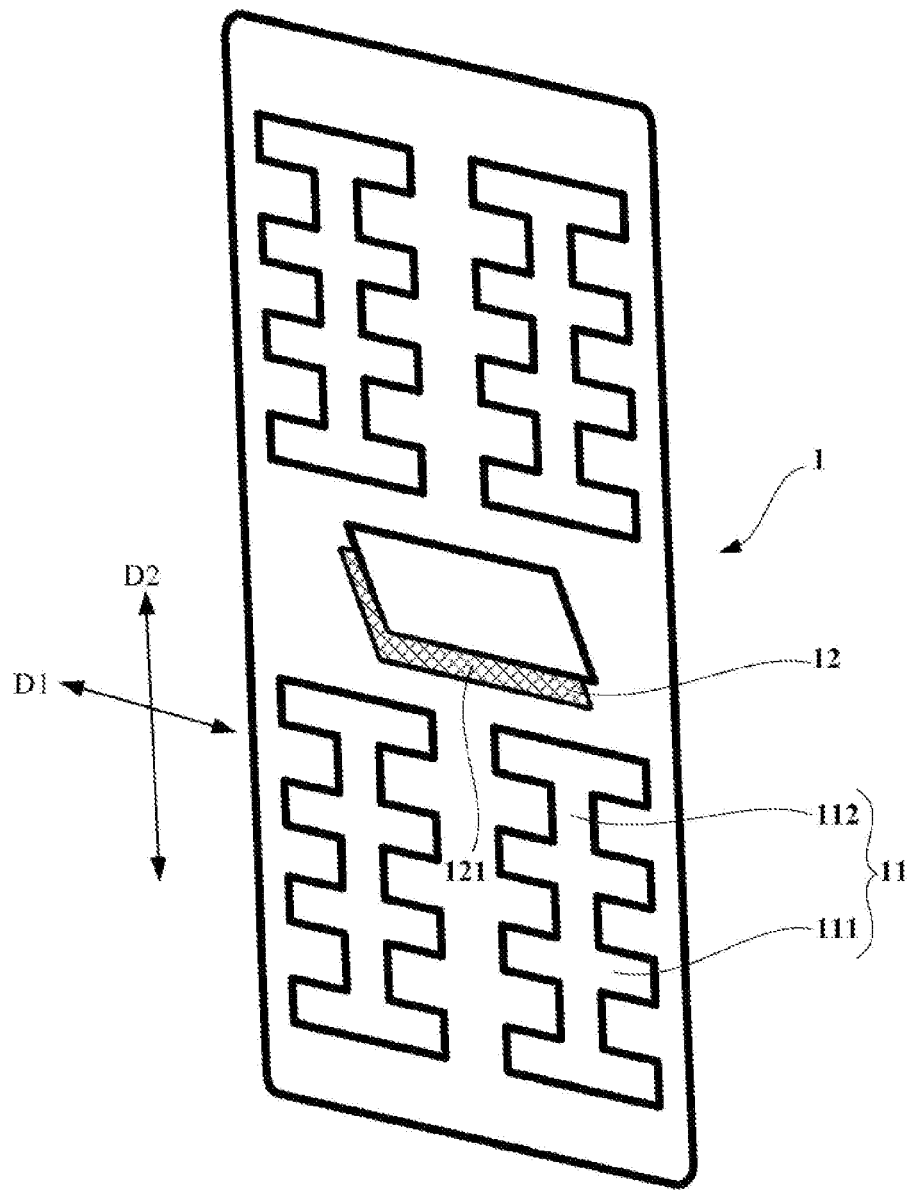
FIG. 4 is a schematic structural view of plug board according to an embodiment of the present disclosure.

As shown in FIG. 1, FIG. 2 and FIG. 4, the embodiment of the present disclosure provides a carrier frame 100 including at least two plug boards 1 and a plurality of support rods 2.

Each plug board 1 has a plurality of hollow insert parts 11. Either end of the support rod 2 can be inserted into any one of hollow insert parts 11.

The carrier frame 100 can be in a first state: at least two plug boards 1 are arranged in parallel and two adjacent plug boards 1 are connected by a support rod 2

The carrier frame 100 of the embodiment of the present disclosure may be used to carrier a housing of a backlight module, and also suitable for carrier a metal front frame of a display module, and may also be used for carrier a frame of other types of products, which is not specifically limited herein.

When the carrier frame 100 is in the first state, the specific number of the support rods 2 connecting the two adjacent plug boards 1 is not limited, and may be designed according to the specific shape of the frame 10. For example, a frame 10 for a backlight module is usually a rectangular frame, therefore, there are four support rods 2 connecting the two adjacent plug boards 1, respectively support the four corners of the frame 10.

Concerning the frame manufacturer, the carrier frame may be used as follows:

One end of each of the four support rods 2 is fixed with the plug board 1, wherein, the insertion positions in the hollow insert parts 11 of the plug board 1 where the support rods 2 is inserted may be selected according to the specific size of the frame 10;

A plurality of frames 10 are hung on four support rods 2;

The other plug board 1 is fixed with the other end of the four support rods 2, and the insertion positions in the hollow insert parts 11 of the two side plug boards 1 where both ends of each of the four support rods 2 are inserted correspond to one another;

After the above steps are completed, the carrier frame 100 carrying the frame 10 can be packaged and transported as a whole. It is worth mentioning that, as shown in FIG. 2, according to actual requirements more support rods 2 and the plug boards 1 can be continuously assembled on one surface of the foregoing carrier frame 100 in a manner similar to the foregoing as so to carry more frames 10.

When the carrier frame 100 is in the first state, the specific number of the plug boards 1 included in the carrier frame 100 is not limited. As shown in FIG. 1, in this embodiment, there are two plug boards 1, which are arranged in parallel and connected to each other by four support rods 2. As shown in FIG. 2, in this embodiment, there are three plug boards 1, which are arranged in parallel, and two adjacent plug boards 1 are connected by four support rods 2.

In the carrier frame 100 according to the embodiment of the present disclosure, the insertion position of the hollow insert part 11 where the support rod 2 is inserted can be adjusted according to the specific size of the frame 10, the carrier frame 100 can be applied to frames in various sizes, thusly having good universality.

In a casing that at least two plug boards 1 are arranged in parallel and two adjacent plug boards 1 are connected by four support rods 2, the carrier frame 100 can be used for packaging and transportation of the frame 10, such that the four corners of the frame 10 are stably supported by the four support rods 2, therefore, the frame is not easily deformed and damaged during transportation, which not only improves the transportation efficiency of the frame 10, but also reduces the production cost.

In addition, compared to the packaging trays in the related art, all the components of the carrier frame 100 of the present disclosure can be disassembled, which is convenient for transporting, and can be reassembled after cleaning, therefore, the recycling rate is high, thereby reducing the transportation of the frame and packaging transportation costs.

In the embodiment of the present disclosure, a plurality of hollow insert parts 11 are evenly distributed on each plug board 1. Each hollow insert part 11 includes a plurality of insertion holes 111, and either end of the support rod 2 can be inserted and fixed in any insertion holes 111.

With continued reference to FIG. 4, in this embodiment, the insertion hole 111 is a strip-shaped insertion hole, the length direction of the strip-shaped insertion hole is set along a first direction D1, and the plurality of strip-shaped insertion holes of the hollow insert part 11 are sequentially arranged along a second direction D2. The hollow insert part 11 also includes a strip-shaped guide hole 112, the strip-shaped guide hole 112 and a plurality of strip-shaped insertion holes are cross and communicated with each other, any end of the support rod 2 can be inserted into the strip-shaped guide hole 112 and slide into any one of the strip-shaped insertion hole to be fixed. The strip-shaped guide hole 112 is convenient for the movement and positioning of the support rod 2 in the hollow insert part 11.

In the embodiment of the present disclosure, the specific direction of the first direction is not limited. For example, the horizontal direction may be defined as the first direction, and the second direction may intersect with the first direction perpendicularly or at a certain angle.

Optionally, each strip-shaped guide hole 112 is in cross communication with the middle of the aforementioned plurality of strip-shaped insertion holes. In other alternative embodiments of the present disclosure, the strip-shaped guide hole 112 may also be communication with one end of the aforementioned plurality of strip-shaped insertion holes.

Figure 5:
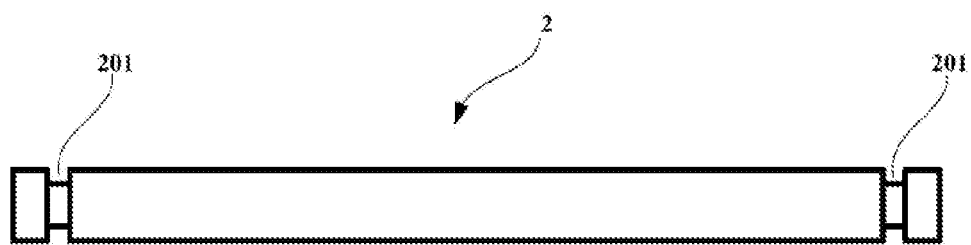
FIG. 5 is a schematic structural view of support rod according to an embodiment of the present disclosure.

As shown in FIG. 5, in the alternative embodiment, both ends of the support rod 2 respectively have an annular clamping groove 201, the groove width of the annular clamping groove 201 is approximately equal to the thickness of the plug board, such that both ends of the support rod 2 may be clamped into the insertion hole through the annular clamping groove 201 and can be fixed at any position of the insertion hole.

Figure 6:
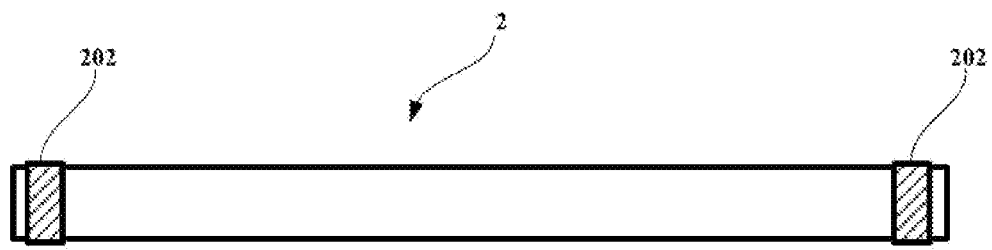
FIG. 6 is a schematic structural view of support rod according to another embodiment of the present disclosure.

As shown in FIG. 6, in the alternative embodiment, both ends of the support rod 2 have rubber sleeves 202, and both ends of the support rod 202 are in interference fit with the insertion hole through the rubber sleeves 202. The rubber sleeve 202 has a certain elasticity, so that both ends of the support rod 2 may be clamped into the insertion hole by the interference fit between the rubber sleeve 202 and the insertion hole, and may be fixed at any position of the insertion hole.

With the design of the above two alternative embodiments, the support rod 2 can be fixed to the insertion hole, and the support rod 2 is not easy to run away from the insertion hole.

In embodiments of the present disclosure, the specific structural form of the support rod 2 is not limited, and for example, the section shape may be circular, square or hexagon, and so on.

In the aforementioned embodiments of the present disclosure, optionally, the plug board 1 is a polycarbonate (PC) plug board, and the support rod 2 is a polycarbonate support rod. Polycarbonate material has the advantages of good toughness, sturdiness, dirt resistance, and easy cleaning and so on, thusly further improving the recovery rate of the carrier frame 100 and further reducing the packaging and transportation costs.

Figure 3:
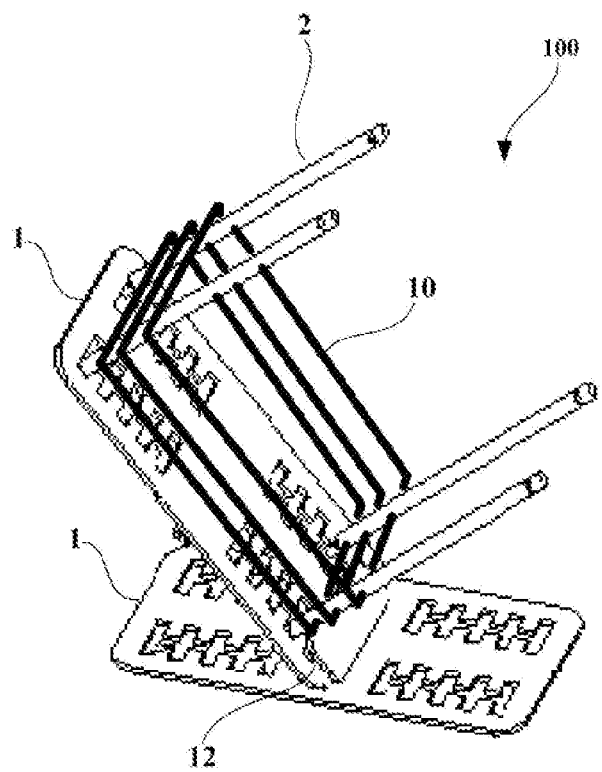
FIG. 3 is a schematic structural view of carrier frame according to yet another embodiment of the present disclosure.

Please refer to FIG. 3 and FIG. 4, in the embodiment of the present disclosure, an insertion groove 12 is provided at one surface of the plug board 1; the carrier frame 100 can also be in a second state, i.e., concerning any two plug boards 1, one plug board 1 is inserted into the insertion groove 12 of the other plug board 1. In case that one of the plug boards 1 connected with four support rods 2 is inserted into the insertion groove 12 of the other plug board 1, the carrier frame 100 can be used for assembling a product such as a backlight module.

In an embodiment, the groove wall of the insertion groove 12 is provided with a rubber pad 121. In this way, two plug boards 1 can be inserted with each other reliably, so that the structure of the carrier frame 100 is more stable.

In a backlight module manufacturer, the carrier frame 100 can be used for assembly of a backlight module, and the frame 10 can be conveniently took away from or put on the four support rods 2 by the operator, which is beneficial to the improvement of the operation assembly efficiency. Optionally, the angle between the insertion groove 12 and the plug board 1 is an acute angle, for example, an angle of 45 degrees or 60 degrees, so that the frame 10 hung on the support rod 12 is not easy to be run away from the carrier frame 100, which is more convenient for assembly and production.

In summary, the carrier frame 100 according to the above-mentioned embodiment of the present disclosure can be applied to frames with variety of sizes, so that it has high universality and can also reduce the risk of deformation and damage of the frame during transportation and improve the transportation efficiency of the frame, and thus effectively reduce the production cost.

In the carrier frame according to the embodiment of the present disclosure, the insertion position of the hollow insert part where the support rod is inserted can be adjusted according to the specific size of the frame, the carrier frame can be applied to frames in various sizes, thusly having good universality. In a casing that the carrier frame is in the first state, that is, at least two plug boards are arranged in parallel and two adjacent plug boards are connected by four support rods, the carrier frame can be used for packaging and transportation of the frame, such that the four corners of the frame are stably supported by the four support rods, therefore, the frame is not easily deformed and damaged during transportation, which not only improves the transportation efficiency of the frame, but also reduce production cost. In addition, compared to packaging trays in the related art, all the components of the carrier frame can be disassembled, which is convenient for transporting, and can be reassembled after cleaning, therefore, the recycling rate is high, thereby reducing the turnover of the frame and packaging transportation costs.

It will be apparent to those skilled in the art that various modifications and variations can be made in the present disclosure without departing from the spirit and scope of the disclosure. Thus, if these modifications and variations of the present disclosure fall within the scope of the claims of the present disclosure and their equivalent technologies, the present disclosure also intends to include these modifications and variations.

What is claimed is:

1. A carrier frame comprising:
   at least two plug boards, each plug board comprising a plurality of hollow insert parts; and
   a plurality of support rods;
   wherein either end of the support rod is configured to be inserted into any one of the hollow insert parts;
   the carrier frame has a first state, in the first state, the at least two plug boards are arranged in parallel and two adjacent plug boards are connected through the support rods,
   the plurality of hollow insert parts are distributed on each plug board, each hollow insert part comprises a plurality of insertion holes and either end of the support rod is configured to be inserted and fixed in any one of the insertion holes,
   the hole is a strip-shaped insertion hole, a length direction of the striped-shaped insertion hole is set along a first direction, the plurality of strip-shaped insertion holes of each hollow insert part are arranged along a second direction in sequence,
   the hollow insert part further comprises a strip-shaped guide holes, the strip-shaped guide hole of each hollow insert part and the plurality of strip-shaped insertion holes are cross and communicated with each other, either end of the support rod is configured to be inserted into the strip-shaped guide hole and slide in any one of the strip-shaped insertion holes so as to be fixed.

2. The carrier frame according to claim 1, wherein, both ends of the support rod respectively have an annular clamping groove, a groove width of the annular clamping groove is approximately equal to a thickness of the plug board.

3. The carrier frame according to claim 1, wherein, the both ends of the support rod respectively have a rubber sleeve, and both ends of the support rod are in interference fit with the insertion hole through the rubber sleeve.

4. The carrier frame according to claim 1, wherein, a cross sectional shape of the support rod is a circle, a square or a hexagon.

5. The carrier frame according to claim 1, wherein, a material of the plug board is polycarbonate, and a material of the support rod is polycarbonate.

6. The carrier frame according to claim 1, wherein, a number of the plug boards is three, when the carrier frame is in the first state, the three plug boards are arranged in parallel and the two adjacent plug boards are connected through the support rod.

7. The carrier frame according to claim 1, wherein, an insertion groove is arranged on one surface of the plug board;
   the carrier frame has a second state, in the second state, one of two plug boards is inserted into the insertion groove of the other one of the two plug boards.

8. The carrier frame according to claim 7, wherein, an angle between the insertion groove and the plug board is an acute angle.

9. The carrier frame according to claim 8, wherein, the angle between the insertion groove and the plug board is 45 degrees or 60 degrees.

10. The carrier frame according to claim 7, wherein, a groove wall of the insertion groove is provided with a rubber pad.

* * * * *